United States Patent [19]

Kimura et al.

[11] Patent Number: 5,773,347

[45] Date of Patent: Jun. 30, 1998

[54] METHOD OF MAUFACTURING FIELD EFFECT TRANSISTOR

[75] Inventors: Masatoshi Kimura; Takio Ohno, both of Hyogo, Japan

[73] Assignee: Mitsubishi Denki Kabushiki Kaisha, Tokyo, Japan

[21] Appl. No.: 601,543

[22] Filed: Feb. 14, 1996

Related U.S. Application Data

[63] Continuation of Ser. No. 318,408, Oct. 5, 1994, abandoned.

[30] Foreign Application Priority Data

Mar. 25, 1994 [JP] Japan .................................. 6-055909

[51] Int. Cl.⁶ .............................................. H01L 21/335
[52] U.S. Cl. ........................ 438/302; 438/303; 438/586; 438/682; 438/902
[58] Field of Search .................................... 438/299, 301, 438/302, 303, 306, 307, 229, 230, 231, 232, 233, 586, 655, 664, 682, 683

[56] References Cited

U.S. PATENT DOCUMENTS

| | | |
|---|---|---|
| 4,080,719 | 3/1978 | Wilting .................................. 437/912 |
| 4,818,715 | 4/1989 | Chao . |
| 4,868,138 | 9/1989 | Chan et al. ............................. 437/44 |
| 4,876,213 | 10/1989 | Pfiester . |
| 4,885,259 | 12/1989 | Osinski et al. ......................... 437/41 |
| 5,030,582 | 7/1991 | Miyajima et al. ...................... 437/34 |
| 5,045,486 | 9/1991 | Chittipeddi et al. ................... 437/41 |
| 5,073,510 | 12/1991 | Kwon et al. ............................ 437/40 |
| 5,270,226 | 12/1993 | Hori et al. .............................. 437/35 |
| 5,302,538 | 4/1994 | Ishikawa et al. ....................... 437/40 |
| 5,322,809 | 6/1994 | Moslehi ................................. 437/41 |
| 5,352,631 | 10/1994 | Sitaram et al. ......................... 437/200 |

FOREIGN PATENT DOCUMENTS

| | | |
|---|---|---|
| 61-258477 | 11/1986 | Japan . |
| 62-183163 | 8/1987 | Japan . |
| 63-142676 | 6/1988 | Japan . |
| 1-307266 | 12/1989 | Japan . |
| 2-27737 | 1/1990 | Japan . |
| 4-186843 | 7/1992 | Japan . |
| 5-62993 | 3/1993 | Japan . |

OTHER PUBLICATIONS

J.R. Pfiester, "A Self–Aligned Elevated Source/Drain MOSFET," IEEE Electron Device Letters, vol. 11, No. 9, Sep. 1990, 365–367.

"The Use of TISI$_2$ For Self Aligned Silicide (Salicide) Technology", C.Y. Ting et al., IEEE Multilevel Interconnection Conf., pp. 307–318, Jun. 25–26, 1985.

"The Resistance and Morphology of Submicron TISI$_2$ and SOSI$_2$ Lines on Polysilicon", J.P. Gambio et al., Extended Abstracts, pp. 312–313, Oct. 13–17, 1991.

*Primary Examiner*—T. N. Quach
*Attorney, Agent, or Firm*—McDermott, Will & Emery

[57] ABSTRACT

A method of manufacturing a field effect transistor can prevent increase of a sheet resistance of a metal silicide layer formed on a gate electrode. In this method of manufacturing the field effect transistor, gate electrode protective layers are formed on the gate electrodes. Using the gate electrode layers as a mask, impurity is ion-implanted into a semiconductor substrate to form source/drain regions. Thereby, the ion implantation for forming the source/drain regions can be performed without ion-implanting the impurity into top surfaces of the gate electrodes. As a result, increase of a sheet resistance of the metal silicide layer, which is formed on the top surfaces of the gate electrodes, is prevented. The use of rotary implantation and of gate protective layer including a silicon oxide film and an etching stopper layer formed on the oxide film is also disclosed.

3 Claims, 22 Drawing Sheets

METHOD OF MAUFACTURING FIELD EFFECT TRANSISTOR

This application is a continuation of application Ser. No. 08/318.408 filed Oct. 5, 1994 abandoned.

BACKGROUND OF THE INVENTION

1. Field of the Invention

The present invention relates to a method of manufacturing a field effect transistor, and in particular to a method of manufacturing a field effect transistor having a salicide (Self Aligned Silicide) structure.

2. Description of the Background Art

FIGS. 42–46 are cross sections showing a process of manufacturing an MOS transistor having a salicide structure in the prior art, and specifically showing a structure thereof. The process shown in these figures is disclosed, for example, in IEEE Multilevel Interconnection Conference Proceeding, pp. 307–318, 1985. Referring to FIGS. 42–46, a method of manufacturing the MOS transistor having the salicide structure in the prior art will be described below.

As shown in FIG. 42, field oxide films 105 for isolating elements are formed on a main surface of a semiconductor substrate 101. A gate oxide film 125 is formed on an active region surrounded by field oxide films 105. A gate electrode 104 made of doped polysilicon is formed on gate oxide film 125 located at a channel region. Using gate electrode 104 and field oxide film 105 as a mask, n-type impurity is ion-implanted into semiconductor substrate 101. Thereby, $n^+$-regions 115 which will form source/drain regions are formed.

A film such as a TEOS oxide film (not shown) is deposited on the whole surface, and then, the TEOS oxide film is etched back. Thereby, side wall oxide films 123 are formed on the side surfaces of gate electrode 104 as shown in FIG. 43.

Then, as shown in FIG. 44, a layer 124 of metal having a high melting point is formed on the whole surface. Then, heat treatment is performed, for example, by an RTA (Rapid Thermal Annealing) method. Thereby, high melting point metal silicide layers 119 are formed on the surfaces of $n^+$-regions 115 and gate electrode 104. Then, high melting point metal layer 124 which has not changed into high melting point metal silicide layer 119 is removed. Thereby, a structure shown in FIG. 45 is obtained.

Referring to FIG. 46, an interlayer insulating film 126 is formed on the whole surface. Contact holes 126 are formed at portions of interlayer insulating film 126 located above $n^+$-regions 115. Contact barrier layers 127 are formed in the contact holes such that they are in contact with high melting point metal silicide layers 119. Metal interconnections 128 are formed on contact barrier layers 127. In this manner, the salicide-MOS transistor in the prior art is completed.

According to the method of manufacturing the salicide-MOS transistor in the prior art described above, the impurity which is ion-implanted into semiconductor substrate 101 for forming n+-regions 115 is disadvantageously implanted partially into the top surface of gate electrode 104. There is a phenomenon that a sheet resistance of high melting point metal silicide layer 119 formed on the top surface of doped polysilicon film 104 increases as the amount of impurity added into the top surface of doped polysilicon film 104 increases. This phenomenon becomes more remarkable as a line width of an interconnection formed of doped polysilicon film (gate electrode) 104 decreases. These facts are disclosed, for example, in Extended Abstract of ECS fall meeting (1991), p. 312.

If the sheet resistance of high melting point metal silicide layer 119 formed on gate electrode (doped polysilicon film) 104 is high as described above, transference delay of signals becomes remarkable in an element such as a clock driver having a long interconnection to gate electrode 104.

SUMMARY OF THE INVENTION

An object of the invention is to provided a method of manufacturing a field effect transistor allowing easy manufacturing of a field effect transistor which suppresses transference delay of a signal on a gate electrode interconnection.

Another object of the invention is to provide a method of manufacturing a field effect transistor, which can effectively prevent increase of a sheet resistance of a metal silicide layer formed on a top surface of a gate electrode.

According to a method of manufacturing a field effect transistor of an aspect of the invention, a gate electrode is formed at a predetermined region on a main surface of a semiconductor substrate. A gate electrode protective layer is formed on the gate electrode. Using the gate electrode protective layer as a mask, impurity is ion-implanted into the main surface of the semiconductor substrate to form source/drain regions. A side wall insulating film is formed on a side surface of the gate electrode. The gate electrode protective layer is removed. A metal silicide layer is formed in a self-aligning manner on the source/drain regions and the top surface of the gate electrode. Preferably, the gate electrode protective layer may be formed such that it includes an oxide film formed on the top surface of the gate electrode and an etching stopper layer formed on the oxide film. Preferably, the gate electrode protective layer may be made of a photoresist.

According to the method of manufacturing the field effect transistor of the above aspect, the gate electrode protective layer is formed on the gate electrode, and the impurity is ion-implanted into the main surface of the semiconductor substrate using the gate electrode protective layer, whereby the source/drain regions are formed. Therefore, the impurity is prevented from being ion-implanted into the top surface of the gate electrode when forming the source/drain regions. This prevents increase of a concentration of the impurity at the top surface of the gate electrode. Consequently, increase of a sheet resistance of the metal silicide layer, which is formed on the top surface of the gate electrode, is prevented. If the gate electrode protective layer is constructed to include the oxide film formed on the top surface of the gate electrode and the etching stopper layer formed on the oxide layer, the oxide film on the gate electrode is not removed during the etching for forming the side wall insulating film on the side surface of the gate electrode. Thereby, impurity is prevented from being implanted into the top surface of the gate electrode during later ion implantation of impurity using the side wall insulating film as a mask. Consequently, increase of the sheet resistance of the metal silicide layer, which is formed on the top surface of the gate electrode, is prevented. If the gate electrode protective layer is formed of the photoresist, implantation of the impurity into the top surface of the gate electrode can be easily prevented without complicating a manufacturing process.

According to a method of manufacturing a field effect transistor of another aspect of the invention, first and second gate electrodes are formed at first and second transistor formation regions on a main surface of a semiconductor substrate. First and second gate electrode protective layers are formed on first and second gate electrodes, respectively. A cover layer is formed to cover the second transistor formation region. Using the first cover layer and the first gate electrode protective layer as a mask, impurity is ion-implanted into the first transistor formation region to form first source/drain regions. After removing the first cover layer, a second cover layer is formed to cover the first transistor formation region. Using the second cover layer and the second gate electrode protective layer as a mask, impurity is ion-implanted into the second transistor formation region to form second source/drain regions. After removing the second cover layer, first and second side wall insulating films are formed on side surfaces of the first and second gate electrodes, respectively. A metal silicide layer is formed in a self-aligning manner on the first and second source/drain regions and top surfaces of the first and second gate electrodes.

According to the method of manufacturing the field effect transistor of the above aspect, the impurity is ion-implanted into the first transistor formation region with a mask, which is formed of the first cover layer covering the second transistor formation region and the first gate electrode protective layer formed on the first gate electrode, when the first source/drain regions are formed. Therefore, the impurity is prevented from being ion-implanted into the top surface of the first gate electrode. When the second source/drain regions are formed, the ion implantation of the impurity is performed with a mask, which is formed of the second cover layer covering the first transistor formation region and the second gate electrode protective layer formed on the second gate electrode. Therefore, the impurity is prevented from being ion-implanted into the top surface of the second gate electrode. Therefore, increase of the resistance of the metal silicide layer, which is formed on the top surfaces of the first and second gate electrodes, is prevented.

According to a method of manufacturing a field effect transistor of still another aspect of the invention, a gate electrode is formed at a predetermined region on a main surface of a semiconductor substrate. Using the gate electrode as a mask, impurity is ion-implanted into the main surface of the semiconductor substrate to form source/drain regions. A side wall insulating film is formed on a side surface of the gate electrode. A cover layer is formed to cover the gate electrode, the side wall insulating film and the source/drain regions. The cover layer is etched to expose the top surface of the gate electrode. The exposed top surface of the gate electrode is etched through a predetermined thickness. Then, the cover layer is removed. A metal silicide layer is formed on the source/drain regions and the top surface of the gate electrode in a self-aligning manner.

According to the method of manufacturing the field effect transistor of the above aspect, after the cover layer is formed to cover the gate electrode, the cover layer is etched back to expose the top surface of the gate electrode, and the exposed top surface of the gate electrode is etched through the predetermined thickness. Therefore, even if impurity is ion-implanted into the top surface of the gate electrode during the formation of the source/drain regions, the top surface containing the impurity will be removed. Therefore, increase of the sheet resistance of the metal silicide layer, which is formed on the top surface of the gate electrode, is prevented.

According to a method of manufacturing a field effect transistor of yet another aspect of the invention, first and second gate electrodes are formed at first and second transistor formation regions on a main surface of a semiconductor substrate. Using the first gate electrode as a mask, impurity is ion-implanted into the first transistor formation region to form first source/drain regions. Using the second gate electrode as a mask, impurity is ion-implanted into the second transistor formation region to form second source/drain regions. First and second side wall insulating films are formed on side surfaces of the first and second gate electrodes. A cover layer is formed to cover the first and second gate electrodes, the first and second side wall insulating films and the first and second source/drain regions. The cover layer is etched back to expose the top surfaces of the first and second gate electrodes. The exposed top surfaces of the first and second gate electrodes are etched through a predetermined thickness. Then, the cover layer is removed. A metal silicide layer is formed in a self-aligning manner on the first and second source/drain region and the top surfaces of the first and second gate electrodes.

According to the method of manufacturing the semiconductor device of the above aspect, after the cover layer is formed to cover the first and second gate electrodes, the cover layer is etched back to expose the top surfaces of the first and second gate electrodes, and the exposed top surfaces of the first and second gate electrodes are etched through the predetermined thickness. Therefore, even if impurity is ion-implanted into the top surfaces of the first and second gate electrodes during the formation of the first and second source/drain regions, the portions containing the implanted ion will be removed. Therefore, increase of the sheet resistance of the metal silicide layer, which is formed on the top surfaces of the gate electrodes, is prevented.

According to a method of manufacturing a field effect transistor of a further aspect of the invention, a gate electrode, source/drain regions and a side wall insulating film are formed. A semiconductor layer is selectively grown on the source/drain regions and a top surface of the gate electrode. After forming a metal layer on the semiconductor layer, heat treatment is performed to form a metal silicide layer.

According to the method of manufacturing the field effect transistor of the above aspect of the invention, after ion implantation of the impurity is performed for forming the source/drain regions using the gate electrode as a mask, the semiconductor layer is selectively grown on the top surface of the gate electrode, and the metal silicide layer is formed on the semiconductor layer. Therefore, even if impurity is ion-implanted into the top surface of the gate electrode during formation of the source/drain regions, increase of the sheet resistance of the metal silicide layer formed on the semiconductor layer is prevented.

According to a method of manufacturing a field effect transistor of a still further aspect of the invention, first and second gate electrodes are formed at first and second transistor formation regions. Also, first source/drain regions and second source/drain regions are formed. First and second side wall insulating films are formed on side surfaces of the first and second gate electrodes. A semiconductor layer is selectively grown on the first and second source/drain regions and top surfaces of the first and second gate electrodes. After forming a metal layer on the semiconductor layer, heat treatment is performed to form a metal silicide layer.

According to the method of manufacturing of the field effect transistor of the above aspect, after impurity is ion-implanted into the semiconductor substrate to form the first and second source/drain regions using the first and second gate electrodes as a mask, respectively, the semiconductor layer is grown on the top surfaces of the first and second gate electrodes, and the metal silicide layer is formed on the semiconductor layer. Therefore, even if impurity is ion-implanted into the top surfaces of the first and second gate electrodes during formation of the first and second source/drain regions, increase of the sheet resistance of the metal silicide layer formed on the semiconductor layer is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Referring to FIGS. 1 to 13, a process of manufacturing a salicide-MOS transistor of a first embodiment will be described below.

Figure 1:
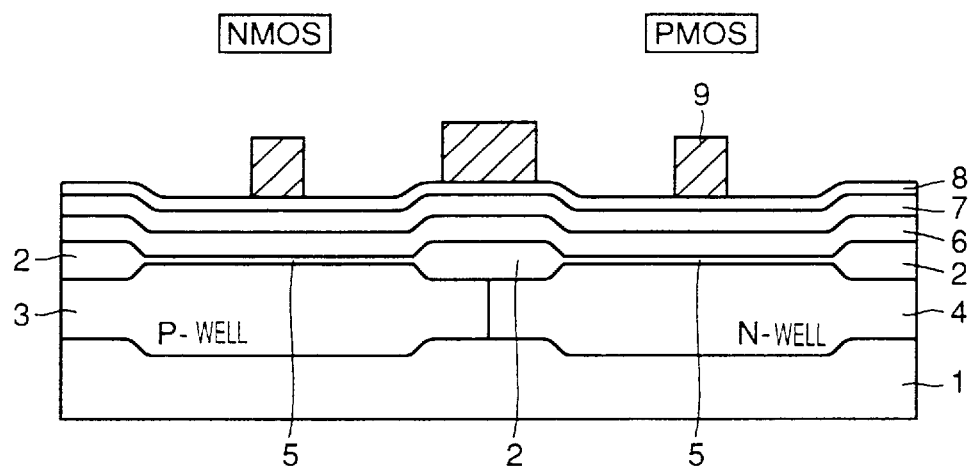
FIGS. 1 to 13 are cross sections showing 1st to 13th steps in a process of manufacturing a salicide-MOS transistor of a first embodiment of the invention, respectively.

As shown in FIG. 1, field oxide films 2 for isolating elements are formed at predetermined regions on a main surface of a semiconductor substrate 1. A P-well and an N-well adjoining to each other are formed on the main surface of semiconductor substrate 1. Gate oxide films 5 are formed on regions surrounded by field oxide films 2. A doped polysilicon layer 6 having a thickness from about 2000 to about 4000 Å is formed on gate oxide films 5 and field oxide films 2 by a CVD method. Doped polysilicon layer 6 is doped with phosphorus at an impurity concentration from $1\times10^{20}$ to $5\times10^{20}$ cm$^{-3}$. Then, an TEOS oxide film 7 having a thickness from about 300 to about 1000 Å is formed on doped polysilicon layer 6 by the CVD method. A TiN layer 8 having a thickness from about 300 to about 1000 Å is formed on TEOS oxide film 7. A photoresist 9 is formed at predetermined regions on TiN layer 8 by photolithography.

Figure 2:
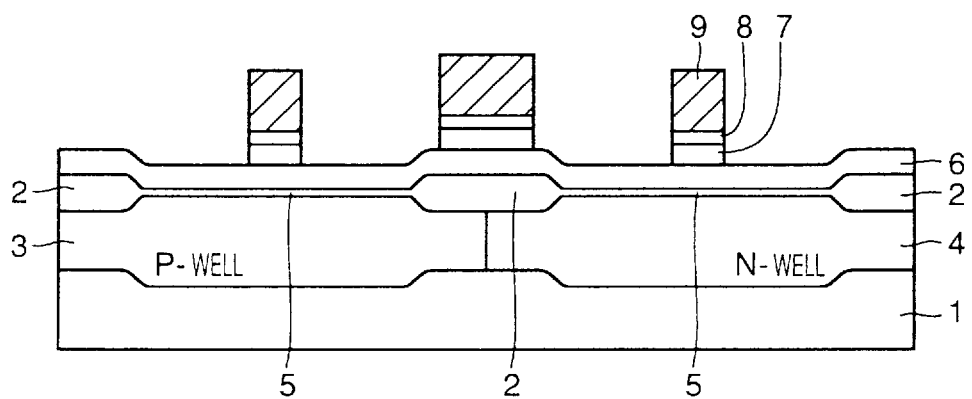

Using photoresist 9 as a mask, anisotropic etching is effected on TiN layer 8 and TEOS oxide film 7. Thereby, patterned TEOS oxide film 7 and patterned TiN layer 8 shown in FIG. 2 are obtained. Thereafter, photoresist 9 is removed.

Figure 3:
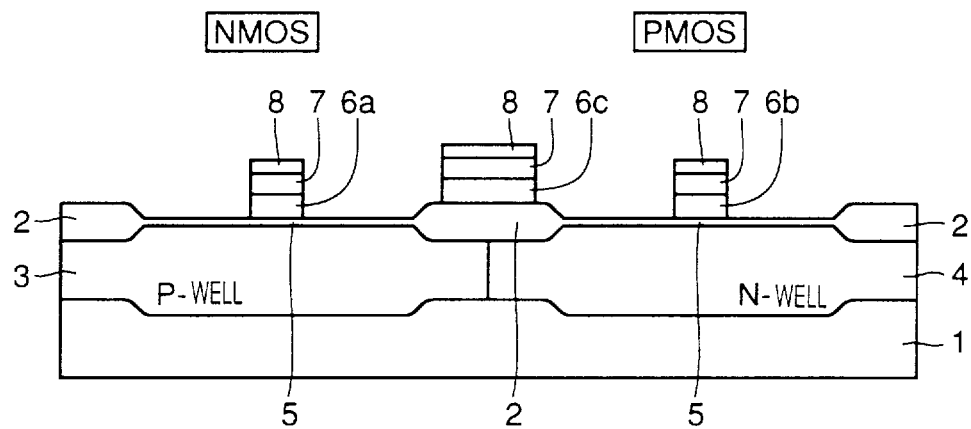

Using TiN layer 8 and TEOS film 7 as a mask, anisotropic etching is effected on doped polysilicon layer 6. Thereby, gate electrodes 6a, 6b and 6c made of doped polysilicon layers are obtained as shown in FIG. 3.

Figure 4:
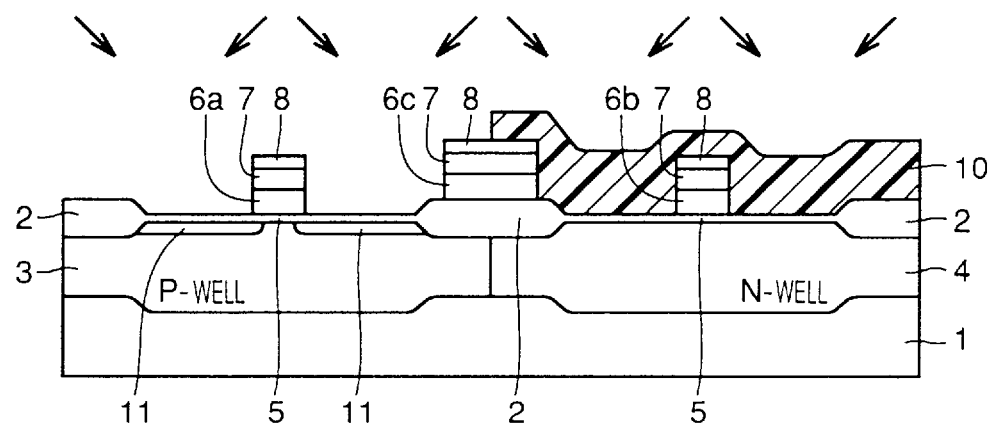

As shown in FIG. 4, a photoresist 10 is formed to cover N-well 4 and gate electrode 6b as well as TEOS oxide film 7 and TiN layer 8 which are located above N-well 4. Phosphorus or arsenic is ion-implanted into P-well 3 with a mask formed of photoresist 10 as well as TEOS oxide film 7 and TiN layer 8 formed on gate electrode 6a. This ion implantation is carried out with an implantation energy from 50 to 80 keV and an impurity concentration from $1\times10^{13}$ to $7\times10^{13}$cm$^{-2}$ as well as rotary implantation of 45 degrees or an implantation angle of 7 degrees. Thereby, N$^-$-regions 11 are formed. During this ion implantation of impurity, the impurity is prevented from being implanted into the top surface of gate electrode 6a because TEOS oxide film 7 and TiN layer 8 are formed on gate electrode 6a.

Figure 5:
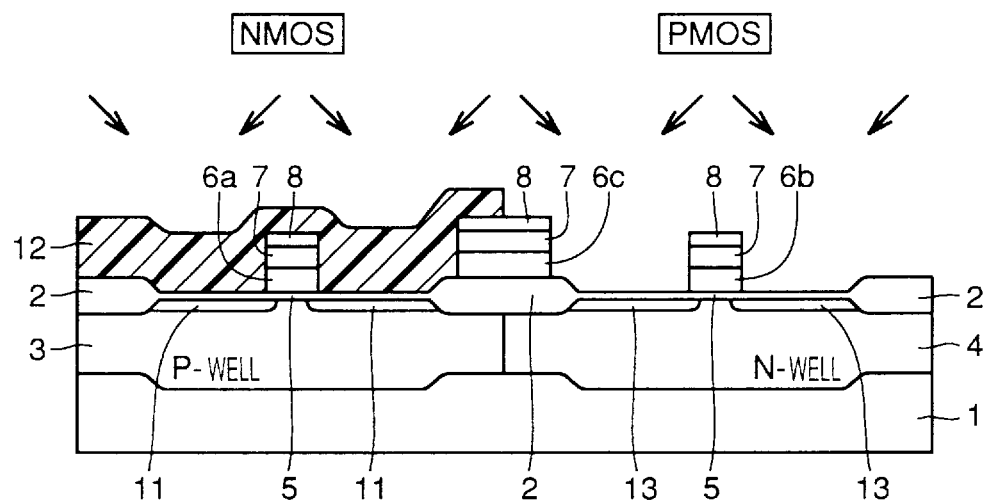

As shown in FIG. 5, a photoresist 12 is formed to cover N$^-$-regions 11, gate electrode 6a as well as TEOS oxide film 7 and TiN layer 8 which are formed on gate electrode 6a. Using photoresist 12 and TiN layer 8 on gate electrode 6b as a mask, B (boron) or BF$_2$ is ion-implanted into N-well 4. This ion implantation is carried out with an implantation energy from 5 to 20 keV and an impurity concentration from $1\times10^{13}$ to $5\times10^{13}$cm$^{-2}$ as well as rotary implantation of 45 degrees or an implantation angle of 7 degrees. Thereby, P$^-$-regions 13 are formed. During this ion implantation of impurity, the impurity is prevented from being implanted into the top surface of gate electrode 6b because TiN layer 8 is formed on gate electrode 6b.

Figure 6:
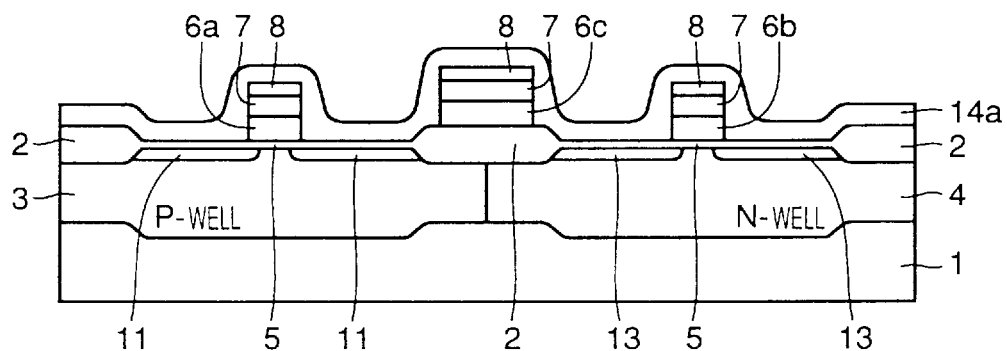
Figure 7:
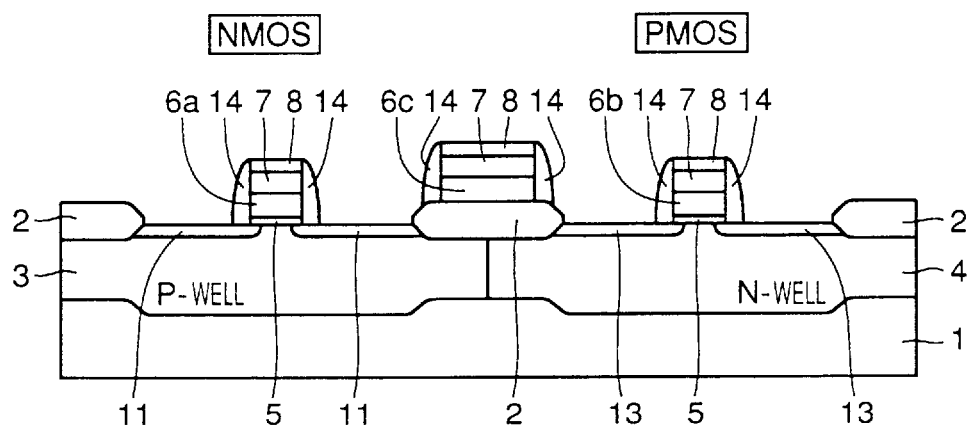

Referring to FIG. 6, a TEOS oxide film 14a having a thickness from about 1000 to about 2000 Å is formed by the CVD method on the whole surface. TEOS oxide film 14a is etched back to form side wall oxide films 14 as shown in FIG. 7. Over-etching for forming side wall oxide films 14 does not cause unpreferable removal of TEOS oxide films 7 on gate electrodes 6a, 6b and 6c, because TiN layers 8 exist on TEOS oxide films 7 when side wall oxide films 14 are etched. Thus, TiN layers 8 serve as an etching stopper. Thereby, such a disadvantage is prevented that impurity is ion-implanted into the top surfaces of gate electrodes 6a and 6b in a later ion-implanting step due to removal of TEOS oxide films 7.

Figure 8:
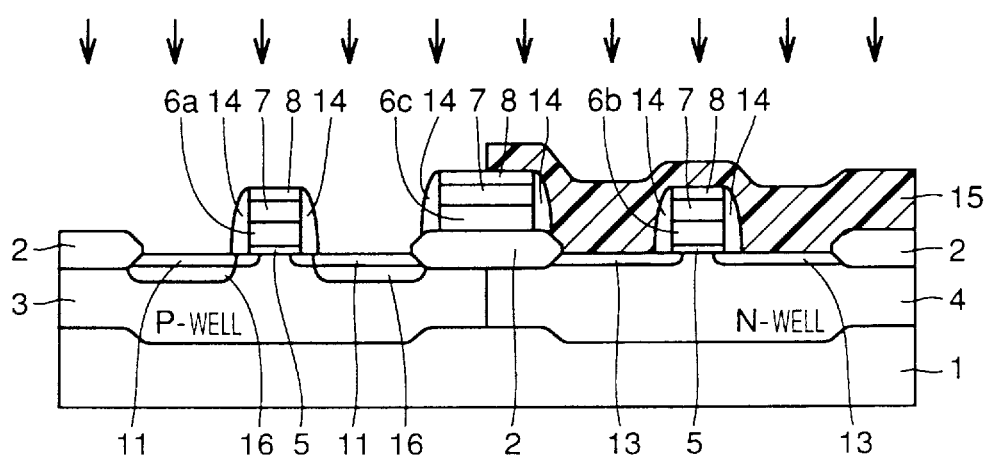

As shown in FIG. 8, a photoresist 15 is formed to cover P$^-$-regions 13. P (phosphorus) or As (arsenic) is ion-implanted into P-well 3 with a mask formed of photoresist 15, TEOS oxide film 7 and TiN layer 8 on gate electrode 6a, and side wall oxide films 14. This ion implantation is carried out with an implantation energy from 40 to 100 keV, an impurity concentration from $1\times10^{15}$ to $7\times10^{15}$ cm$^{-2}$ and an implantation angle of 7 degrees. Thereby, N$^+$-regions 16 are formed. During this ion implantation, the impurity is prevented from being implanted into the top surface of gate electrode 6a because TEOS oxide film 7 and TiN layer 8 are formed on gate electrode 6a. Thereafter, photoresist 15 is removed.

Figure 9:
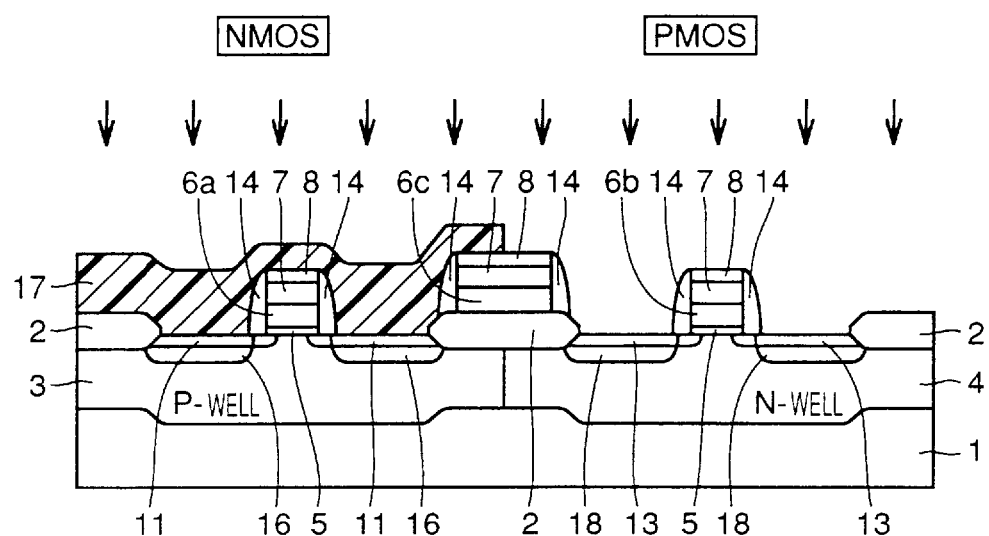
Figure 10:
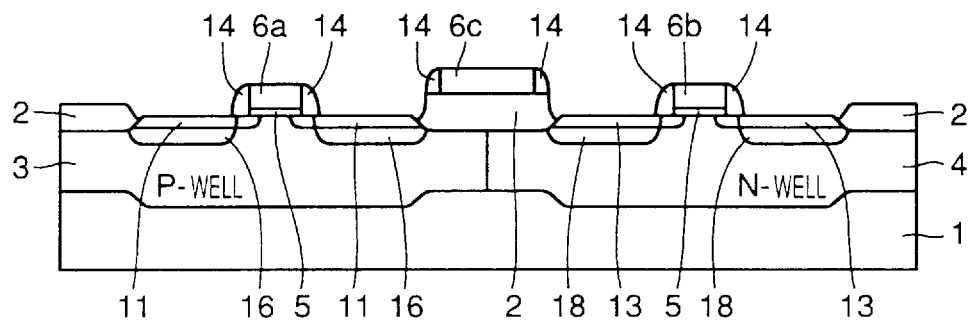

As shown in FIG. 9, a photoresist 17 is formed to cover N$^-$-regions 11. With a mask formed of photoresist 17 as well as TEOS oxide film 7 and TiN layer 8 on gate electrode 6b, and side wall oxide films 14, B or BF$_2$ is ion-implanted into N-well 4. This ion implantation is carried out with an implantation energy from 10 to 30 keV, an impurity concentration from $1\times10^{15}$ to $5\times10^{15}$cm$^{-2}$ and an implantation angle of 7 degrees. Thereby, P$^+$-regions 18 are formed. During this ion implantation, the impurity is prevented from being implanted into the top surface of gate electrode 6b because TEOS oxide film 7 and TiN layer 8 are formed on gate electrode 6b. Thereafter, photoresist 17 is removed.

Then, TiN layers 8 are removed by the wet etching. Thereafter, TEOS oxide films 7 are removed by the dry etching. The dry etching effected on the TEOS oxide films 7 also remove upper portions of side wall oxide films 14. Thereby, side wall oxide films 14 have configurations shown in FIG. 10.

Figure 11:
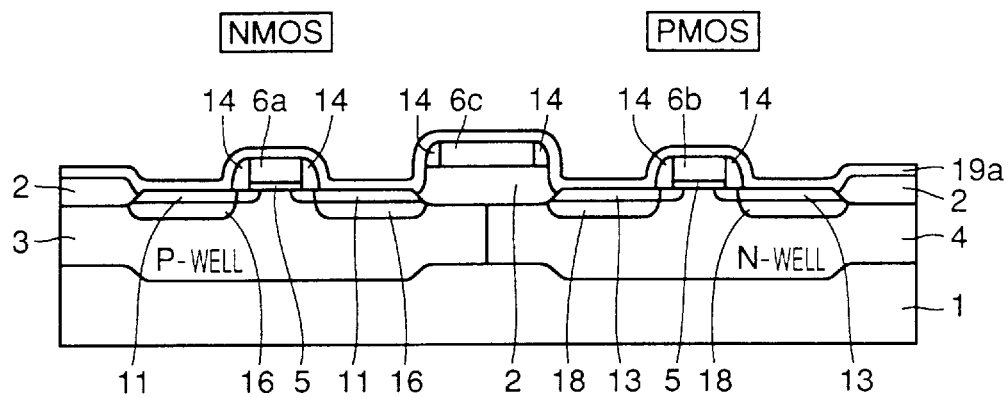
Figure 12:
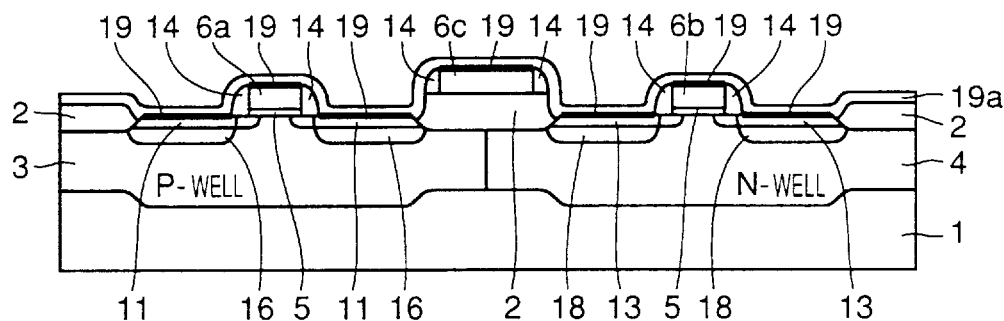

As shown in FIG. 11, a titanium (Ti) layer 19a having a thickness of about 2000 Å is formed on the whole surface by the sputtering method in a vacuum condition. Heat treatment is performed at a temperature of 625° C. in argon atmosphere for 30 minutes. Heat treatment is performed again at a temperature of 800° C. in argon atmosphere for 15 minutes. Thereby, $TiSi_2$ (titanium silicide) layers 19 are formed on $N^-$-regions 11, $P^-$-regions 13 and gate electrodes 6a, 6b and 6c. The above heat treatment may be performed in $N_2$ atmosphere instead of argon atmosphere. Thereafter, remaining Ti layer 19a is removed. Thereby, the configuration shown in FIG. 13 is formed.

In this embodiment, since TEOS oxide films 7 and TiN layers 8 exist on gate electrodes 6a and 6b during the ion-implanting steps shown in FIGS. 4, 5, 8 and 9, it is possible to prevent ion implantation of impurity into the top surfaces of gate electrodes 6a and 6b. Thereby, it is possible to prevent effectively the increase of the sheet resistance of titanium silicide layers 19, which are formed on the top surfaces of gate electrodes 6a and 6b in the later step. As a result, transference delay of signals can be suppressed even in elements including gate electrodes 6a and 6b having a long interconnection length.

Figure 13:
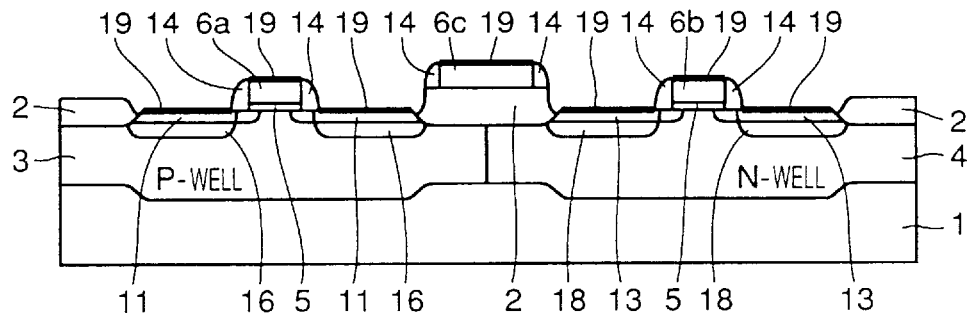
Figure 46:
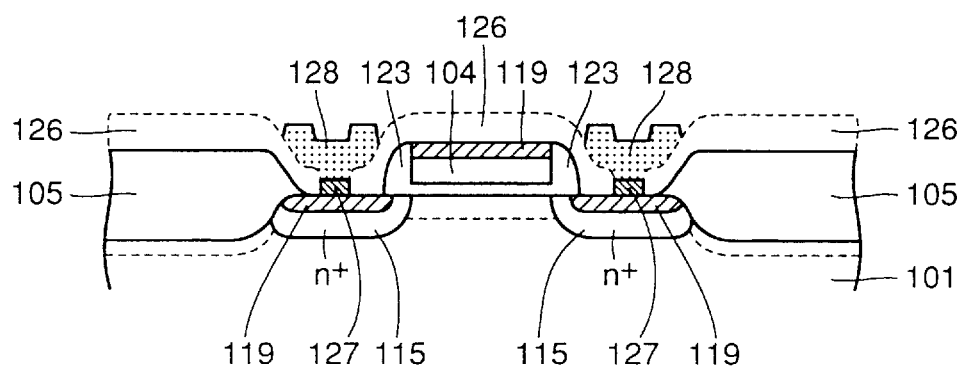

After the step shown in FIG. 13, an interlayer insulating layer, contact holes and interconnections are formed similarly to the conventional process shown in FIG. 46.

Referring to FIGS. 14 to 19, a process of manufacturing a salicide-MOS transistor of a second embodiment will be described below.

Figure 14:
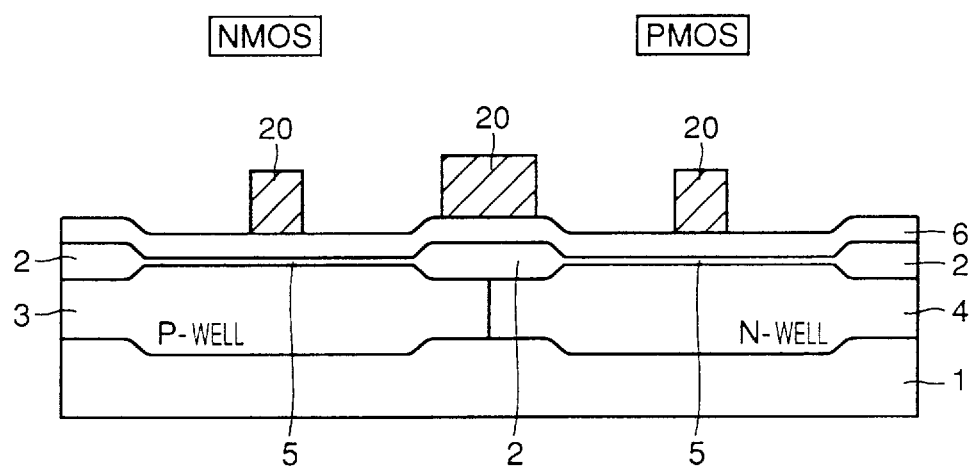
FIGS. 14 to 19 are cross sections showing 1st to 6th steps in a process of manufacturing a salicide-MOS transistor of a second embodiment of the invention, respectively.
Figure 15:
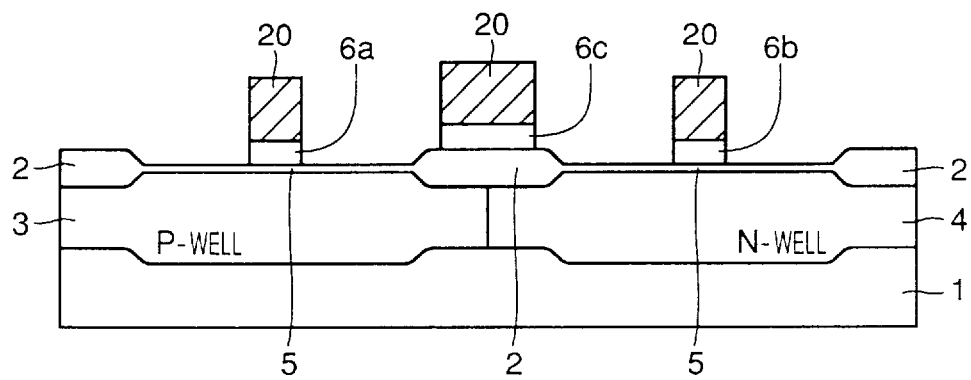

Referring first to FIG. 14, field oxide films 2 for isolating elements are formed on the main surface of semiconductor substrate 1. P-well 3 and N-well 4 adjoining to each other are formed on the main surface of semiconductor substrate 1. Gate oxide films 5 are formed on P-well 3 and N-well 4. Doped polysilicon layer 6 having a thickness from about 2000 to about 4000 Å is formed on P-well 3 and N-well 4 by the CVD method. Doped polysilicon layer 6 is doped with phosphorus at an impurity concentration of $1\times10^{20}$ to $5\times10^{20}cm^{-3}$. A photoresist 20 is formed at predetermined regions on doped polysilicon layer 6 by the photolithography. Using photoresist 20 as a mask, anisotropic etching is effected on doped polysilicon layer 6 to form gate electrodes 6a, 6b and 6c made of doped polysilicon layers as shown in FIG. 15.

Figure 16:
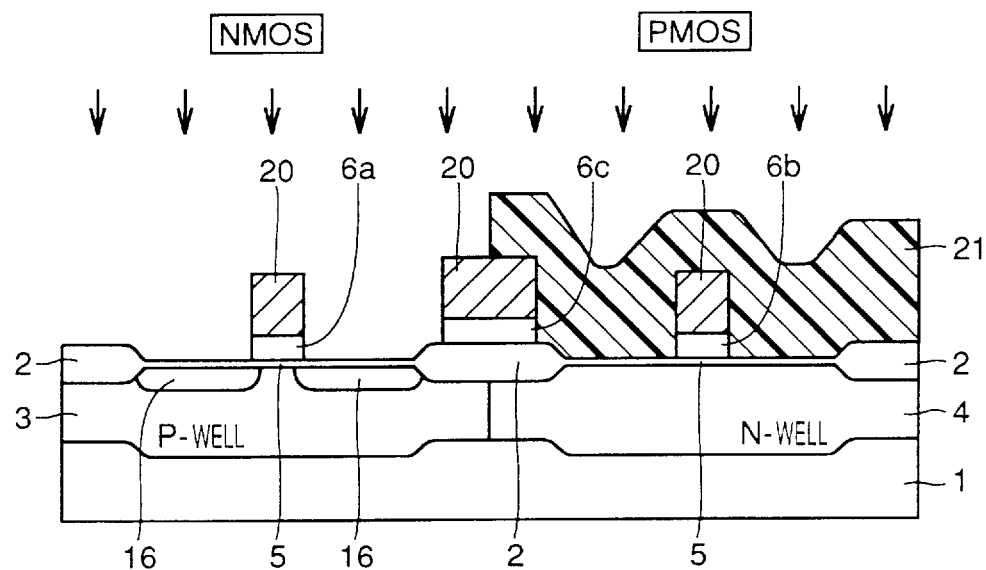

As shown in FIG. 16, a photoresist 21 is formed to cover N-well 4. Using photoresist 21 as well as photoresist 20 on gate electrode 6a as a mask, phosphorus or arsenic is ion-implanted into P-well 3. This ion implantation is carried out with an implantation energy from 40 to 100 keV, an impurity concentration from $1\times10^{15}$ to $7\times10^{15}cm^{-2}$ and an implantation angle of 7 degrees. Thereby, $N^+$-regions 16 are formed. During this ion implantation for forming $N^+$-regions 16, the impurity is prevented from being implanted into the top surface of gate electrode 6a because photoresist 20 is formed on gate electrode 6a. Thereafter, only photoresist 21 is selectively removed.

In order to selectively remove only photoresist 21 without removing photoresist 20, it is necessary to harden photoresist 20 at the step shown in FIG. 14. For this purpose, heat treatment is performed for a time period from 30 to 120 minutes in $N_2$ or Ar atmosphere at a temperature from 100° to 200° C. Thereby, photoresist 20 can be hardened. As a result, photoresist 21 can be removed selectively without removing photoresist 20.

Figure 17:
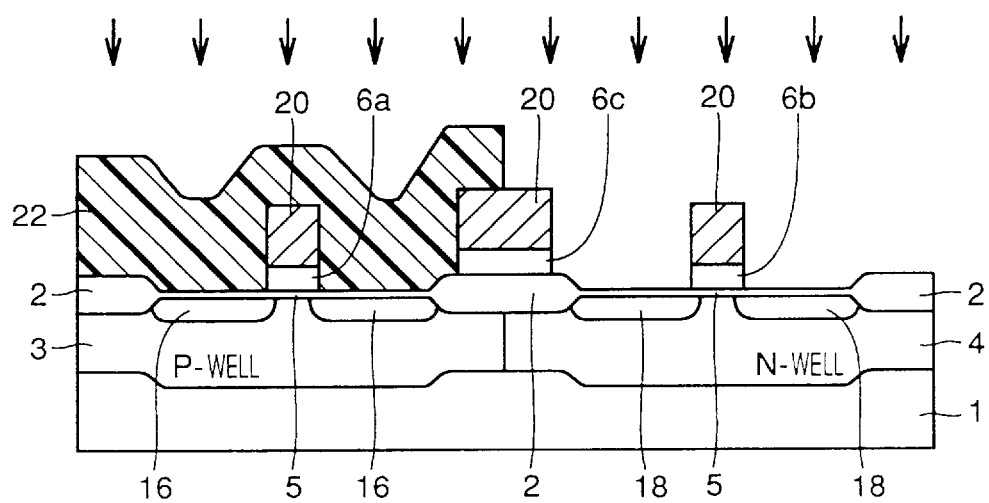

After removing photoresist 21, a photoresist 22 is formed to cover $N^+$-regions 16 as shown in FIG. 17. Using photoresist 22 as well as photoresist 20 on gate electrode 6b as a mask, B or $BF_2$ is ion-implanted into N-well 4. This ion implantation is carried out with an implantation energy from 10 to 30 keV, an impurity concentration from $1\times10^{15}$ to $5\times10^{15}cm^{-2}$ and an implantation angle of 7 degrees. Thereby, $P^+$-regions 18 are formed. Thereafter, only photoresist 22 is selectively removed. Subsequently, photoresist 20 is removed.

Figure 18:
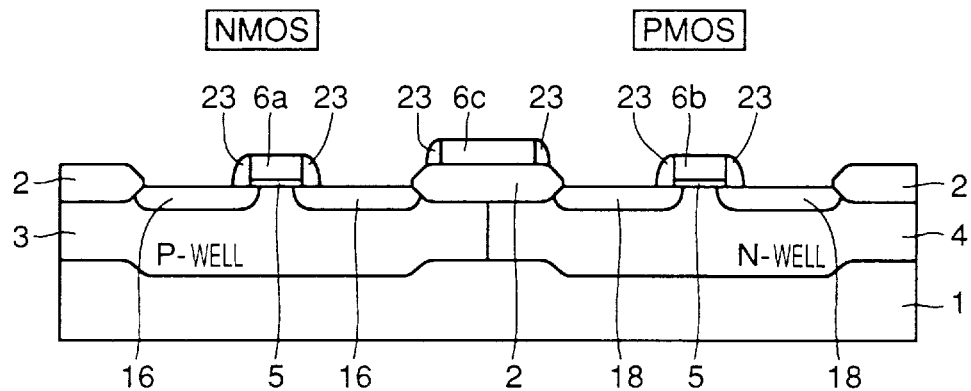
Figure 19:
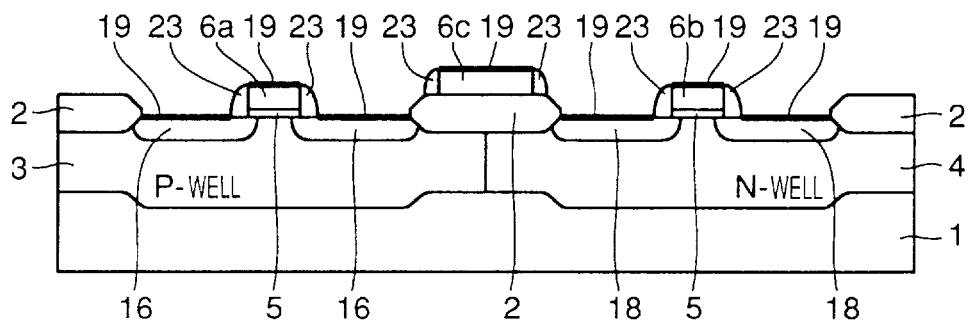

After forming a TEOS oxide film (not shown) from about 1000 to about 2000 Å in thickness on the whole surface, the whole surface is etched back. Thereby, side wall oxide films 23 are formed as shown in FIG. 18.

Finally, titanium silicide ($TiSi_2$) layers 19 are selectively formed on $N^+$-regions 16, $P^+$-regions 18, and gate electrodes 6b and 6c with the process and conditions similar to those of the first embodiment already described.

In the second embodiment described above, photoresist 20 exists on gate electrodes 6a and 6b during the ion-implanting steps shown in FIGS. 16 and 17, so that it is possible to prevent implantation of impurity into the top surfaces of gate electrodes 6a and 6b. Thereby, it is possible to prevent increase of the sheet resistance of titanium silicide layers 19, which are finally formed on the top surfaces of gate electrodes 6a and 6b.

Referring to FIGS. 20 to 31, a process of manufacturing a salicide-MOS transistor of a third embodiment will be described below.

Figure 20:
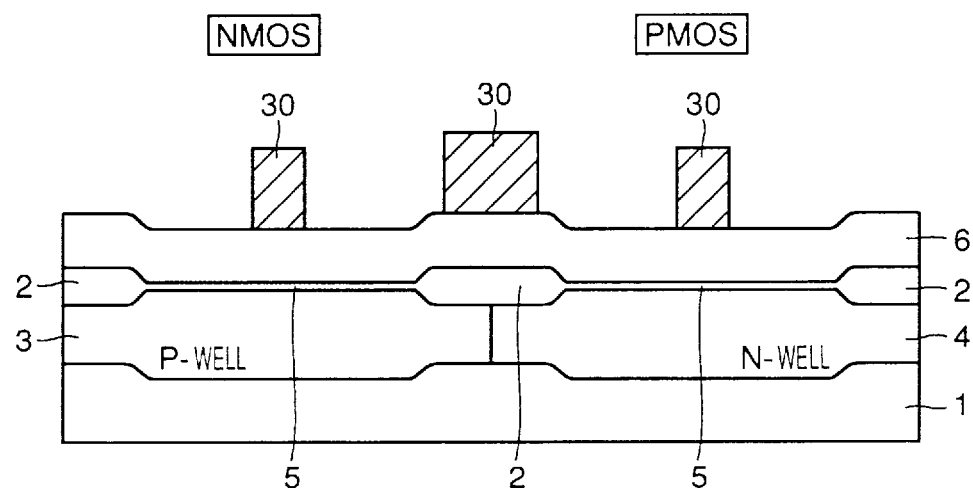
FIGS. 20 to 31 are cross sections showing 1st to 12th steps in a process of manufacturing a salicide-MOS transistor of a third embodiment of the invention, respectively.
Figure 21:
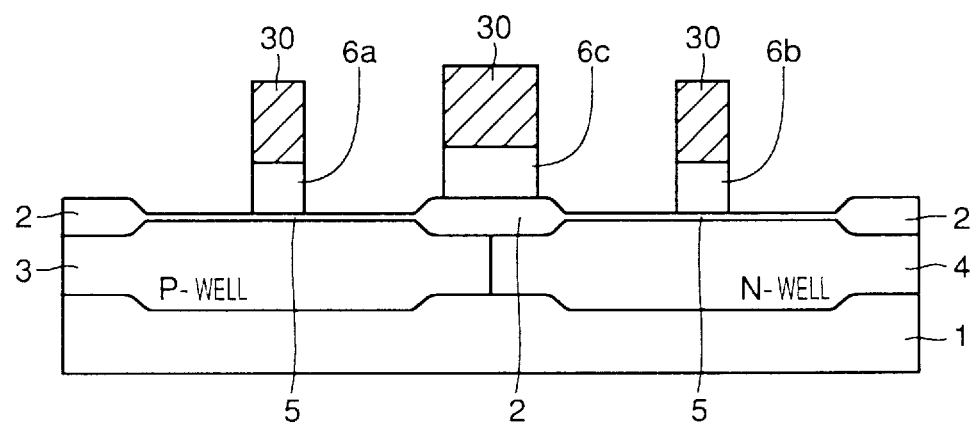

As shown in FIG. 20, field oxide films 2, P-well 3 and N-well 4 are formed on the main surface of semiconductor substrate 1. Gate oxide films 5 are formed on P-well 3 and N-well 4. Doped polysilicon layer 6 from about 4000 to about 6000 Å in thickness is formed on gate oxide films 5 and field oxide films 2. Doped polysilicon layer 6 is doped with phosphorus at an impurity concentration from $1\times10$ to $5\times10^{20}cm^{-3}$. A photoresist 30 is formed at predetermined regions on doped polysilicon layer 6 by photolithography. Using photoresist 30 as a mask, anisotropic etching is effected on doped polysilicon layer 6 to form gate electrodes 6a, 6b and 6c made of doped polysilicon layers as shown in FIG. 21. Thereafter, photoresist 30 is removed.

Figure 22:
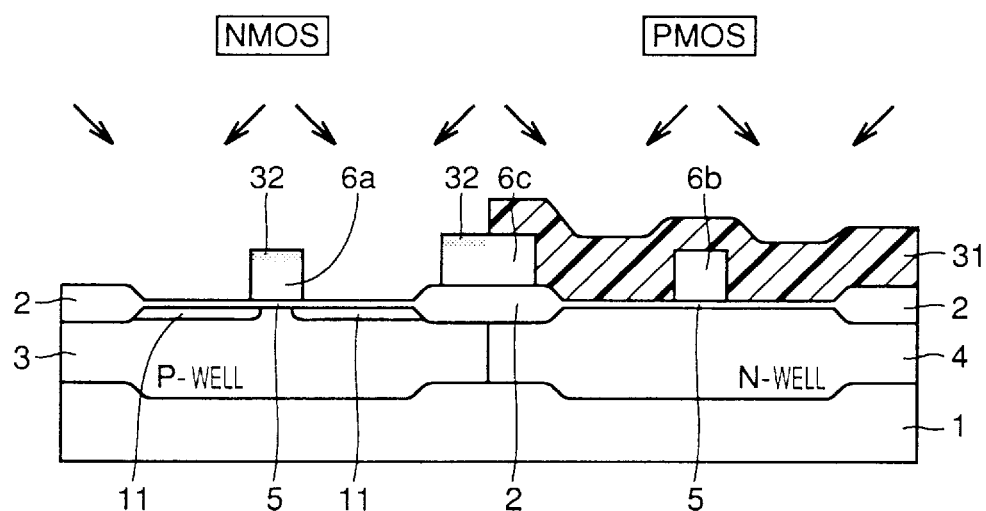

As shown in FIG. 22, a photoresist 31 is formed to cover N-well 4. Using photoresist 31 and gate electrode 6a as a mask, phosphorus or arsenic is ion-implanted into P-well 3. This ion implantation is carried out with an implantation energy from 50 to 80 keV and an impurity concentration from $1\times10^{13}$ to $7\times10^{13}cm^{-2}$ as well as rotary implantation of an implantation angle of 45 degrees or implantation at an implantation angle of 7 degrees. Thereby, $N^-$-regions 11 are formed. At this ion-implanting step, no layer or film exists on the top surface of gate electrode 6a, so that impurity is implanted into the top surface of gate electrode 6a. As a result, an impurity implanted region 32 is formed at the top surface of gate electrode 6a. Thereafter, photoresist 31 is removed.

Figure 23:
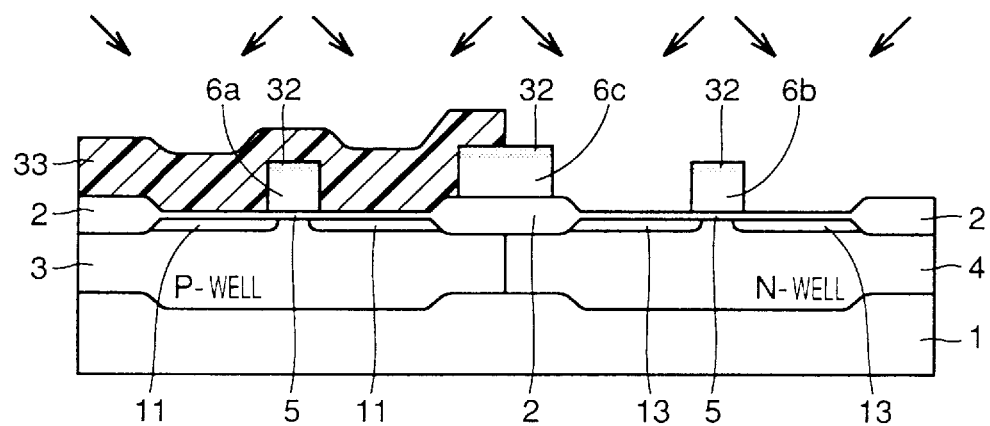

As shown in FIG. 23, a photoresist 33 is formed to cover $N^-$-regions 11 and gate electrode 6a. Using photoresist 33 and gate electrode 6b as a mask, B or $BF_2$ is ion-implanted into N-well 4. This ion implantation is carried out with an implantation energy from 5 to 20 keV and an impurity concentration from $1\times10^{13}$ to $5\times10^{13}cm^{-2}$ as well as rotary implantation of an implantation angle of 45 degrees or implantation at an implantation angle of 7 degrees. Thereby, $P^-$-regions 13 are formed. At this ion-implanting step, no layer or film exists on the top surface of gate electrode 6b, so that impurity is implanted into the top surface of gate electrode 6b. As a result, impurity implanted region 32 is also formed at the top surface of gate electrode 6b. Thereafter, photoresist 33 is removed.

Figure 24:
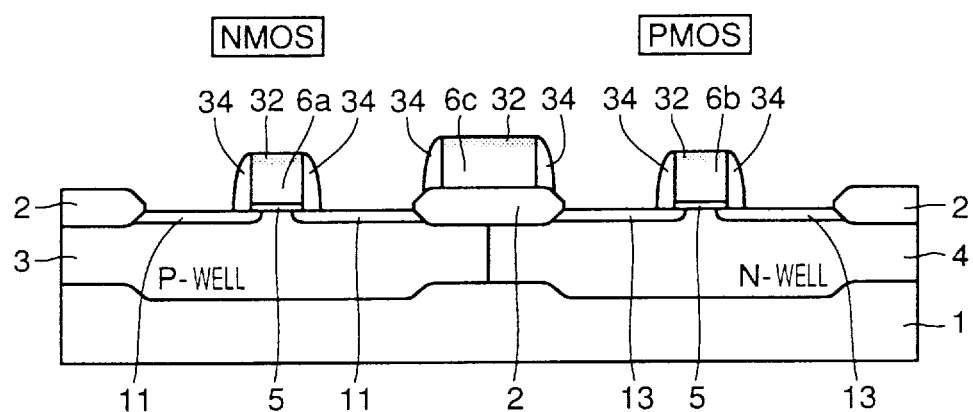

Then, as shown in FIG. 24, side wall oxide films 34 are formed on side surfaces of gate electrodes 6a, 6b and 6c.

Figure 25:
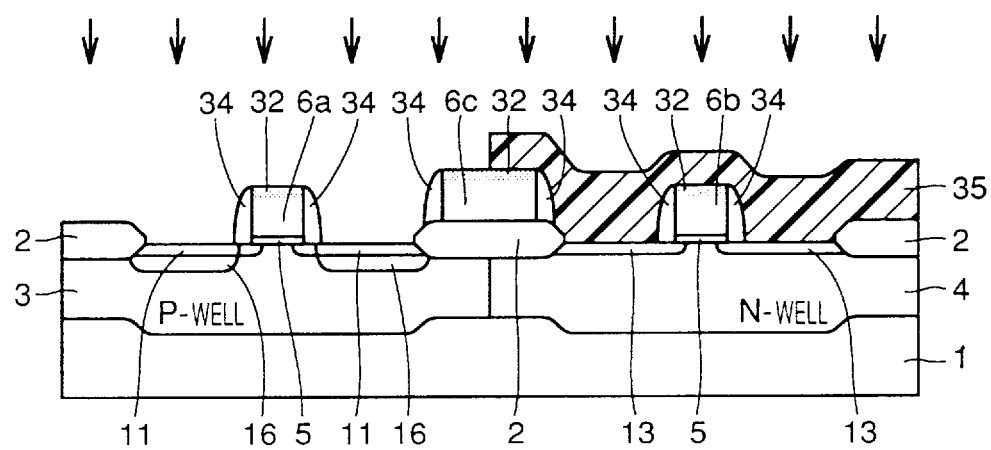

As shown in FIG. 25, a photoresist 35 is formed to cover P⁻-regions 13 and gate electrode 6b. Using photoresist 35, gate electrode 6a and side wall oxide films 34 as a mask, phosphorus or arsenic is ion-implanted into P-well 3. This ion implantation is carried out with an implantation energy from 40 to 100 keV, an impurity concentration from $1\times10^{15}$ to $7\times10^{15} cm^{-2}$ and at an implantation angle of 7 degrees. Thereby, N⁺-regions 16 are formed. At this ion-implanting step, no layer or film exists on the top surface of gate electrode 6a, so that impurity is implanted into the top surface of gate electrode 6a again. Thereafter, photoresist 35 is removed.

Figure 26:
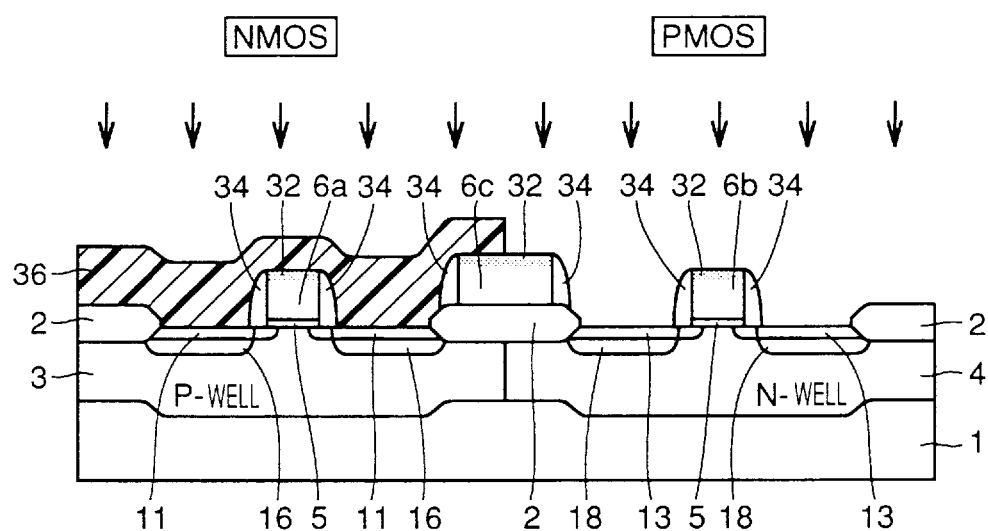

As shown in FIG. 26, a photoresist 36 is formed to cover N⁻-regions 11 and gate electrode 6a. Using photoresist 36, gate electrode 6b and side wall oxide films 34 as a mask, B or $BF_2$ is ion-implanted into N-well 4. This ion implantation is carried out with an implantation energy from 10 to 30 keV, an impurity concentration from $1\times10^{15}$ to $5\times10^{15} cm^{-2}$ and at an implantation angle of 7 degrees. Thereby, P⁺-regions 18 are formed. Also during this ion implantation, no layer or film exists on the top surface of gate electrode 6b, so that impurity is implanted into the top surface of gate electrode 6b. Thereafter, photoresist 36 is removed.

Figure 27:
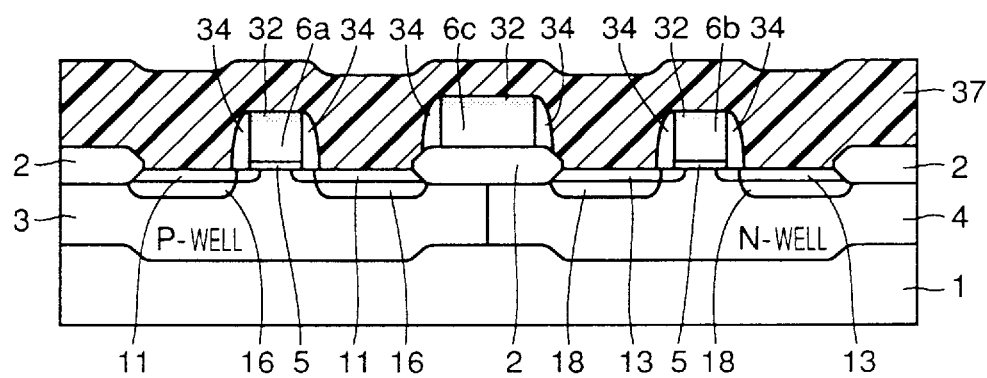
Figure 28:
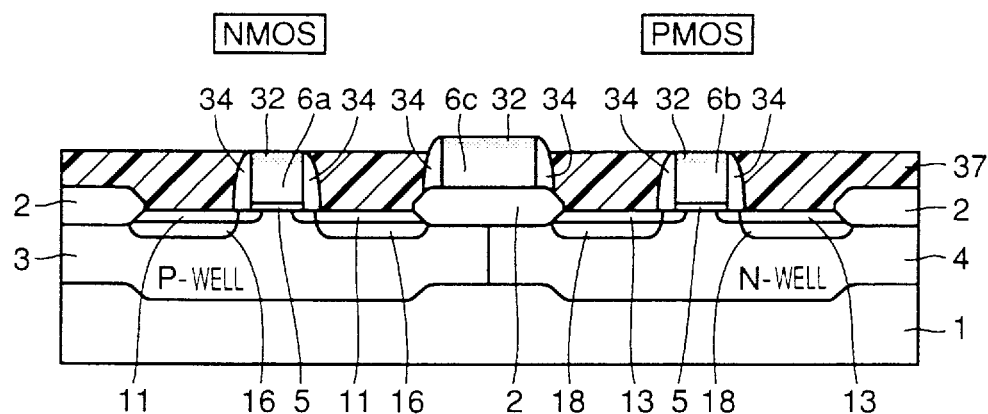

As shown in FIG. 27, a photoresist 37 having a thickness from about 6000 to about 10000 Å is formed to cover the whole surface. A TiN layer or film may be formed instead of photoresist 37. The whole surface of photoresist 37 is etched back. This etch back is performed to such an extent that the top surfaces of gate electrodes 6a and 6b are exposed as shown in FIG. 28.

Figure 29:
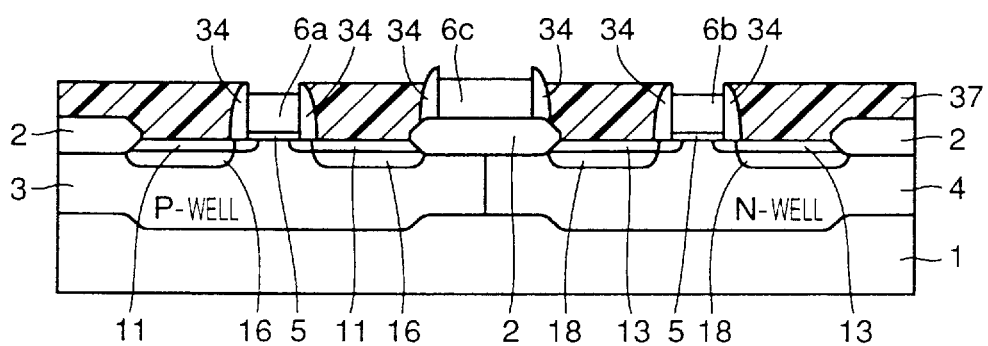
Figure 30:
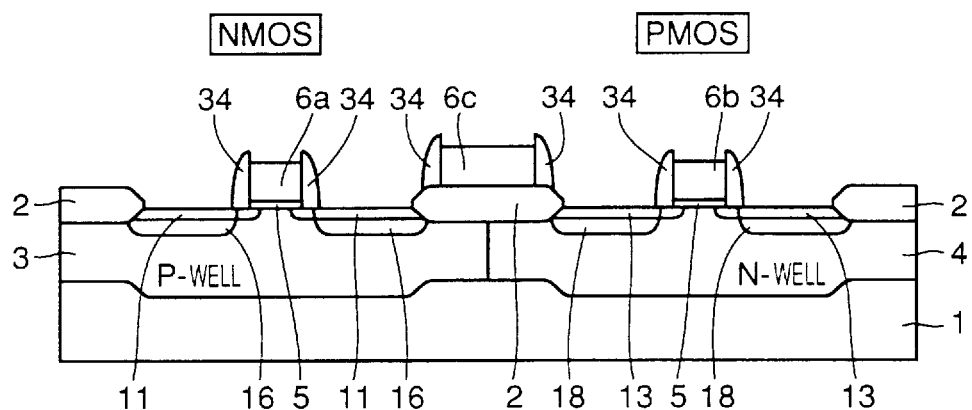

Then, as shown in FIG. 29, anisotropic etching is effected on the top surfaces of gate electrodes 6a, 6b and 6c using photoresist 37 as a mask. Thereby, impurity implanted regions 32 (see FIG. 28) at the top surfaces of gate electrodes 6a, 6b and 6c are removed. The anisotropic etching of the top surfaces of gate electrodes 6a, 6b and 6c is preferably performed to removes the top surface portions of gate electrodes 6a, 6b and 6c by a thickness from about 1000 to about 3000 Å. Such removal does not excessively reduce the film thickness of gate electrodes 6a, 6b and 6c because doped polysilicon layer 6 formed at the step shown in FIG. 20 has a large thickness from about 4000 to about 6000 Å. Thereafter, photoresist 37 is removed. Thereby, the configuration shown in FIG. 30 is obtained.

Figure 31:
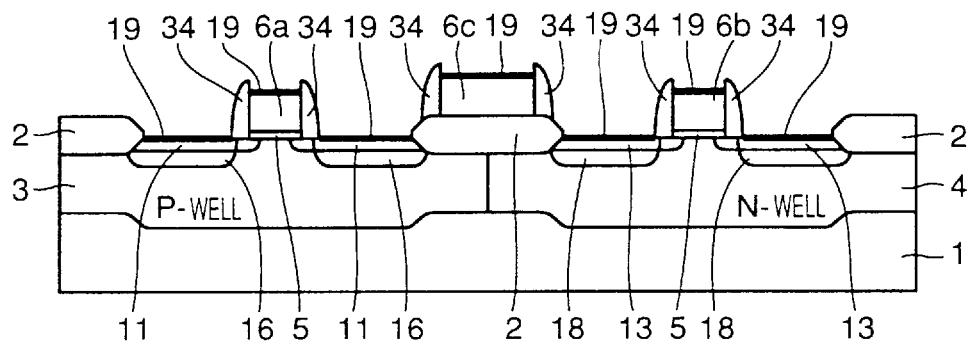

As shown in FIG. 31, titanium silicide ($TiSi_2$) layers 19 are formed selectively on N⁻-regions 11, P⁻-regions 13 and gate electrodes 6a, 6b and 6c. The process of forming titanium silicide layers 19 is the same as that in the first embodiment shown in FIGS. 11 to 13.

As described above, in the process of the third embodiment, ion implanted regions 32 at the top surfaces of gate electrodes 6a, 6b and 6c are removed, whereby it is possible to prevent increase of the sheet resistance of titanium silicide layers 19 formed on the top surfaces of gate electrodes 6a, 6b and 6c.

Referring to FIGS. 32 to 41, a process of manufacturing a salicide-MOS transistor of a fourth embodiment will be described below.

Figure 32:
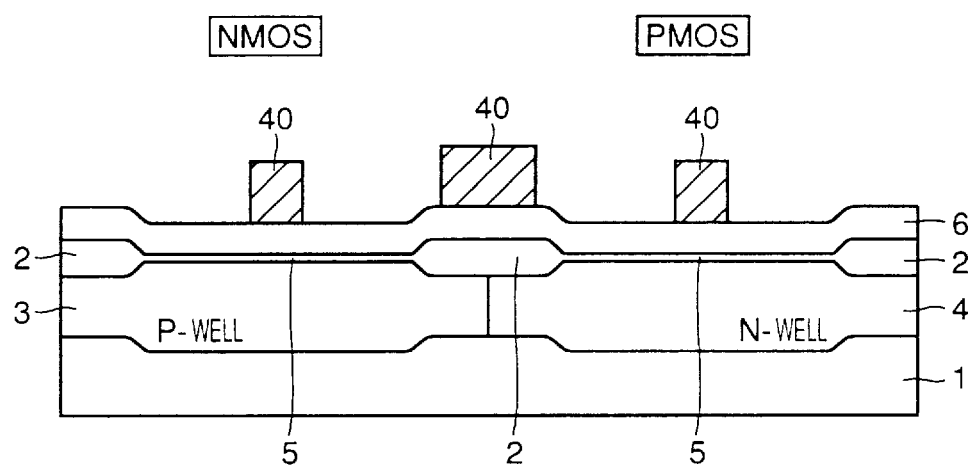
FIGS. 32 to 41 are cross sections showing 1st to 10th steps in a process of manufacturing a salicide-MOS transistor of a first embodiment of the invention, respectively.

As shown in FIG. 32, field oxide films 2, P-well 3 and N-well 4 are formed on the main surface of semiconductor substrate 1. Gate oxide films 5 are formed on P-well 3 and N-well 4. Doped polysilicon layer 6 from about 1000 to about 2000 Å in thickness is formed on gate oxide films 5 and field oxide films 2. Doped polysilicon layer 6 is doped with phosphorus or arsenic at an impurity concentration from $1\times10^{20}$ to $5\times10^{20} cm^{-3}$. Doped polysilicon layer 6 is thinner than doped polysilicon layers 6 of the first and second embodiments.

Figure 33:
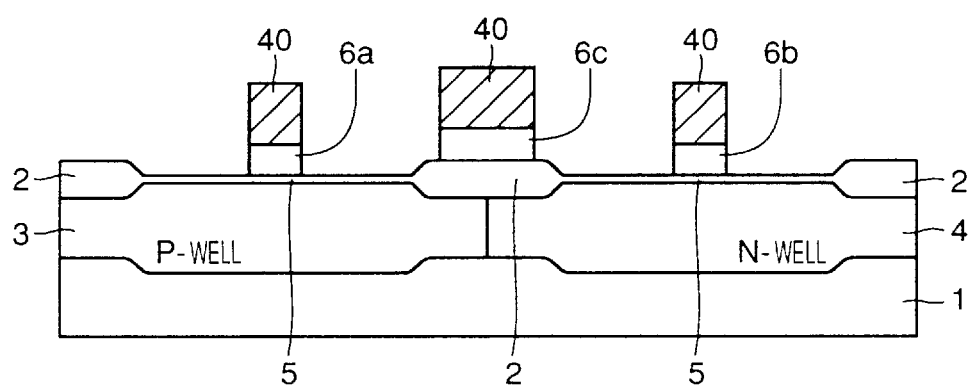

A photoresist 40 is formed at predetermined regions on the top surface of doped polysilicon layer 6 by the photolithography. Using photoresist 40 as a mask, anisotropic etching is effected on doped polysilicon layer 6. Thereby, gate electrodes 6a, 6b and 6c formed of doped polysilicon layers are obtained as shown in FIG. 33. Thereafter, photoresist 40 is removed.

Figure 34:
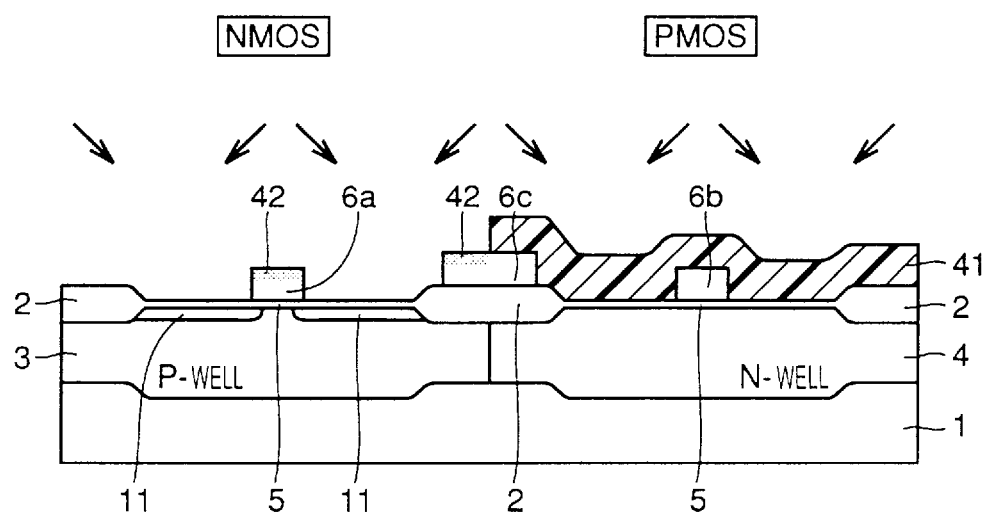

As shown in FIG. 34, a photoresist 41 is formed to cover N-well 4 and gate electrode 6b. Using photoresist 41 and gate electrode 6a as a mask, phosphorus or arsenic is ion-implanted into P-well 3. This ion implantation is carried out with an implantation energy from 50 to 80 keV and an impurity concentration from $1\times10^{13}$ to $7\times10^{13} cm^{-2}$ as well as rotary implantation of an implantation angle of 45 degrees or implantation at an implantation angle of 7 degrees. Thereby, N⁻-regions 11 are formed. During this ion implantation, no layer of film exists on the top surface of gate electrode 6a, so that impurity is implanted into the top surface of gate electrode 6a. As a result, an impurity implanted region 42 is formed. Thereafter, photoresist 41 is removed.

Figure 35:
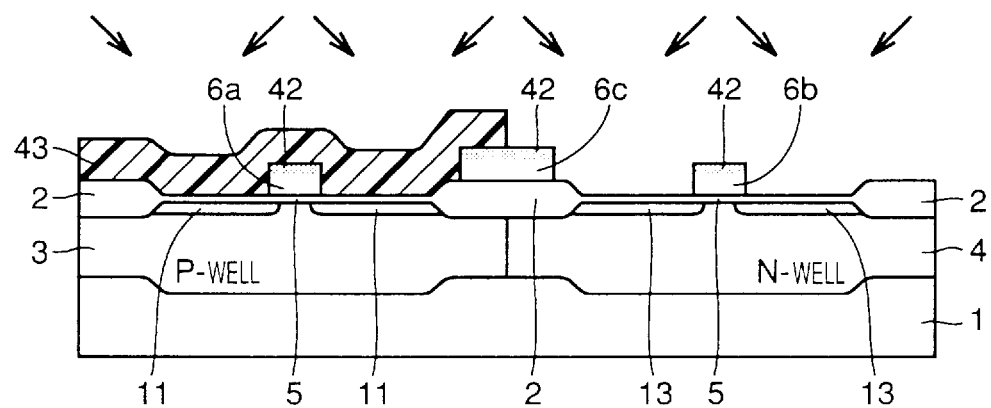

As shown in FIG. 35, a photoresist 43 is formed to cover N⁻-regions 11 and gate electrode 6a. Using photoresist 43 and gate electrode 6b as a mask, B or $BF_2$ is ion-implanted into N-well 4. This ion implantation is carried out with an implantation energy from 5 to 20 keV and an impurity concentration from $1\times10^{13}$ to $5\times10^{13} cm^{-2}$ as well as rotary implantation of an implantation angle of 45 degrees or implantation at an implantation angle of 7 degrees. Thereby, P⁻-regions 13 are formed. During this ion implantation, no layer or film exists on the top surface of gate electrode 6b, so that impurity is implanted into the top surface of gate electrode 6b. As a result, impurity implanted region 42 is also formed at the top surface of gate electrode 6b. Thereafter, photoresist 43 is removed.

Figure 36:
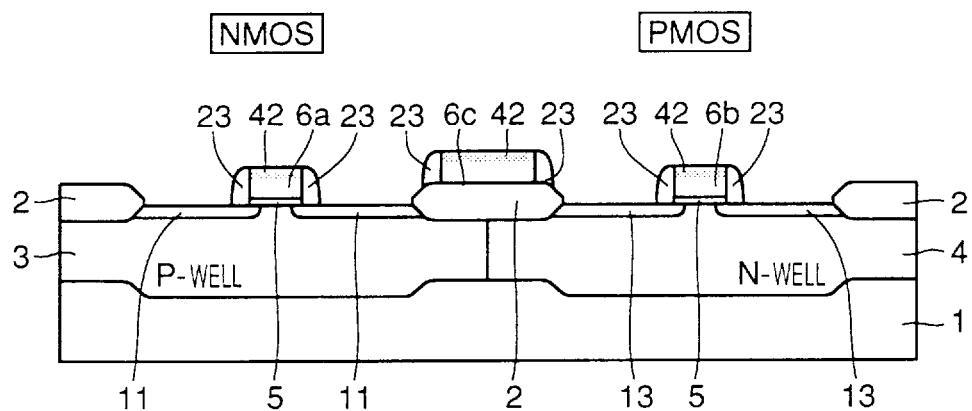

Then, as shown in FIG. 36, side wall oxide films 23 are formed on side surfaces of gate electrodes 6a, 6b and 6c.

Figure 37:
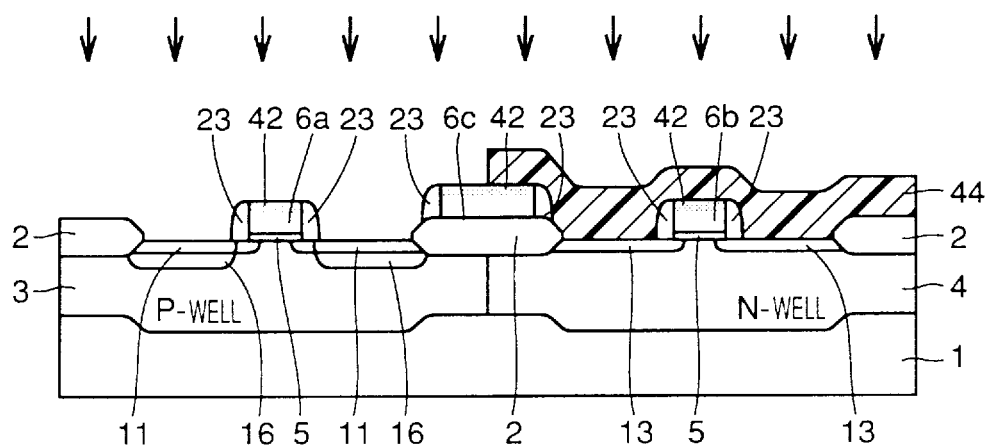

As shown in FIG. 37, a photoresist 44 is formed to cover P⁻-regions 13 and gate electrode 6b. Using photoresist 44, gate electrode 6a and side wall oxide films 23 as a mask, phosphorus or arsenic is ion-implanted into P-well 3. This ion implantation is carried out with an implantation energy from 40 to 100 keV, an impurity concentration from $1\times10^{15}$ to $7\times10^{15} cm^{-2}$ and at an implantation angle of 7 degrees. Thereby, N⁺-regions 16 are formed. During this ion implantation, no layer or film exists on the top surface of gate electrode 6a, so that impurity is implanted into the top surface of gate electrode 6a again. Thereafter, photoresist 44 is removed.

Figure 38:
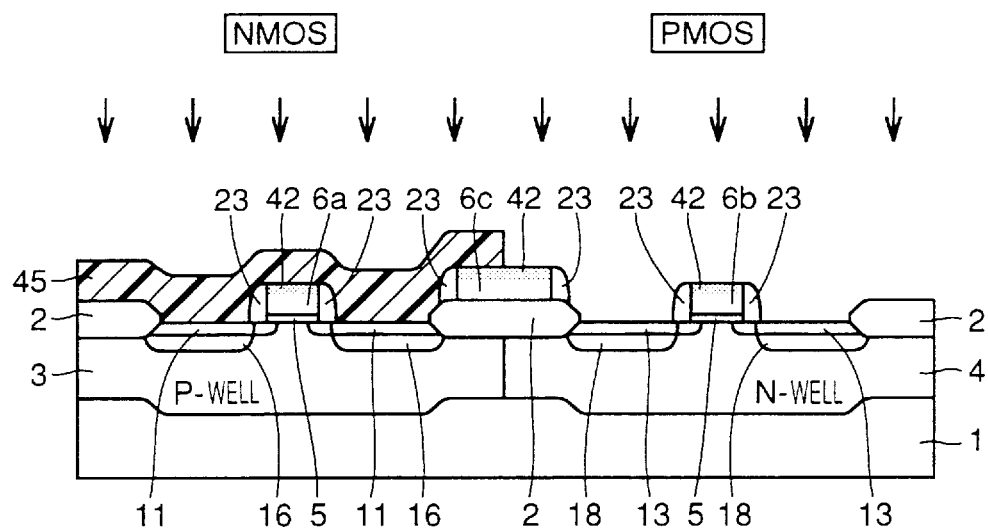
Figure 39:
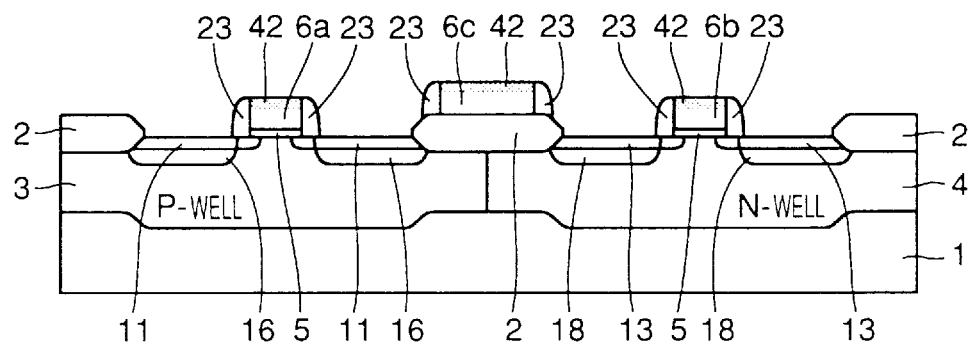

As shown in FIG. 38, a photoresist 45 is formed to cover N⁻-regions 11 and gate electrode 6a. Using photoresist 45, gate electrode 6b and side wall oxide films 23 as a mask, B or $BF_2$ is ion-implanted into N-well 4. This ion implantation is carried out with an implantation energy from 10 to 30 keV, an impurity concentration from $1\times10^{15}$ to $5\times10^{15} cm^{-2}$ and at an implantation angle of 7 degrees. Thereby, P⁺-regions 18 are formed. Also during this ion implantation, no layer or film exists on the top surface of gate electrode 6b, so that impurity is implanted into the top surface of gate electrode 6b again. Thereafter, photoresist 45 is removed. Thereby, the MOS transistor having the LDD structure shown in FIG. 39 is obtained.

Figure 40:
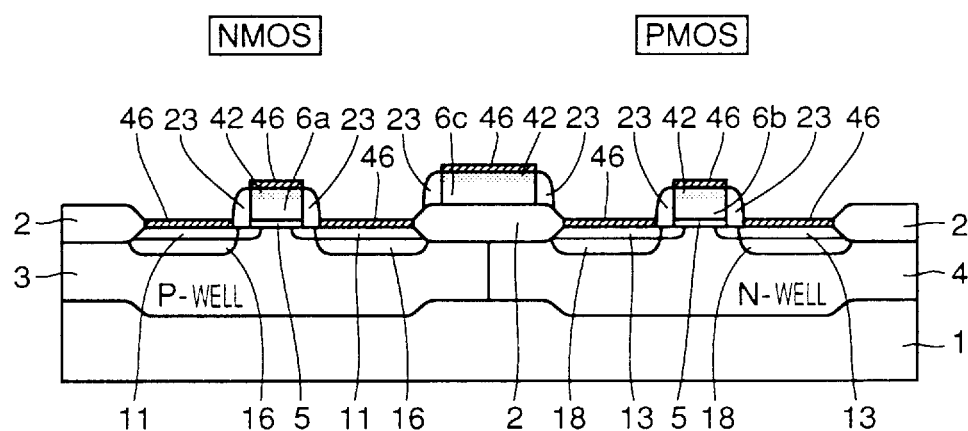
Figure 41:
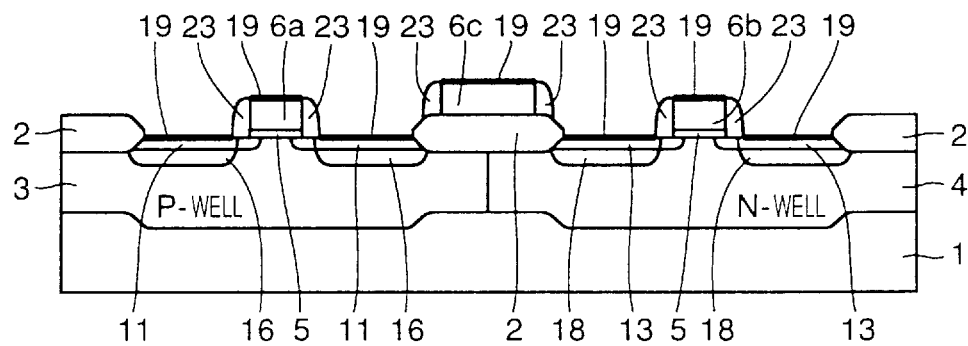
Figure 42:
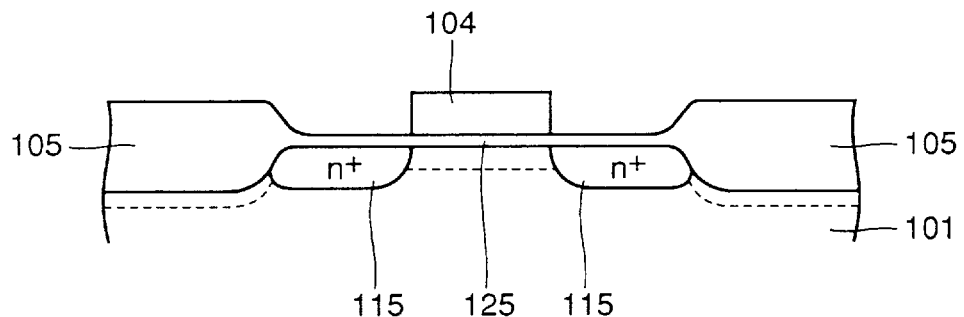
FIGS. 42 to 46 are cross sections showing 1st to 5th steps in a process of manufacturing a salicide-MOS transistor in the prior art, respectively.
Figure 43:
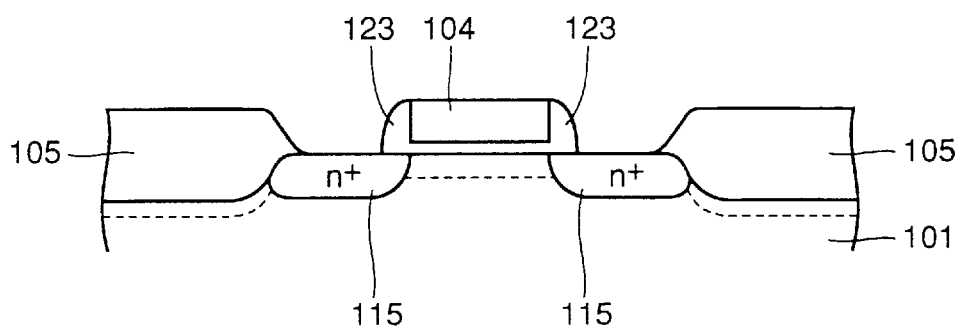
Figure 44:
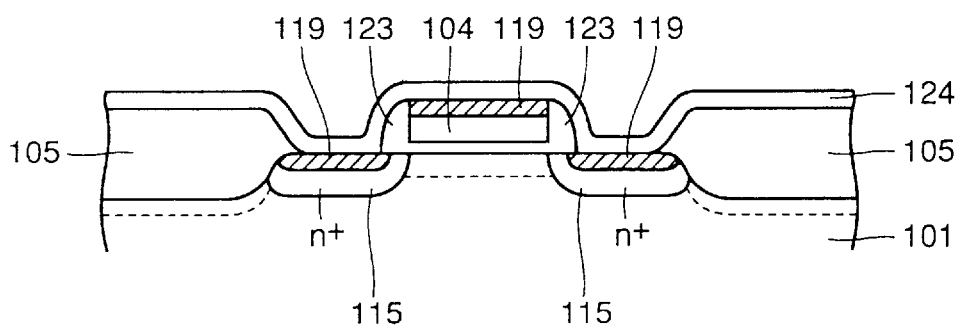
Figure 45:
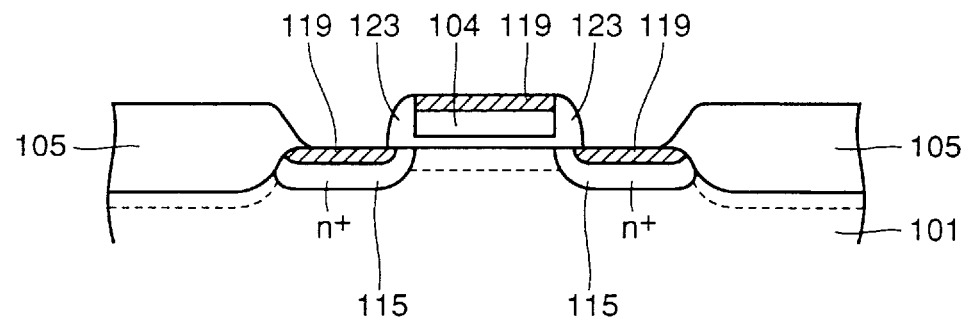

As shown in FIG. 40, semiconductor layers 46 are selectively formed by epitaxial growth on the top surfaces of N⁻-regions 11 and P⁻-regions 13 as well as top surfaces of gate electrodes 6a, 6b and 6c. This epitaxial growth of semiconductor layers 46 is performed to form semiconductor layers 46 having a thickness from about 1000 to about 3000 Å under the following conditions. Thus, the epitaxial growth is performed in atmosphere of $SiCl_4$, $SiHCl_3$, $SiH_2Cl_2$ or $SiH_4$ at a temperature of about 1000° C. or more under a pressure of about 760 Torr. Semiconductor layers 46 are silicided to form titanium silicide ($TiSi_2$) layers 19 as shown in FIG. 41. In this fourth embodiment, titanium silicide layers 19 are formed by the silicidation of semiconductor layers 46. Therefore, even if impurity implanted regions 42 are formed at the top surfaces of gate electrodes 6a, 6b and 6c, impurity implanted regions 42 do not increase the sheet resistance of titanium silicide layers 19. Therefore, it is possible to suppress transference delay of signals even if gate electrodes 6a, 6b and 6c have long interconnections.

According to the method of manufacturing the field effect transistor of one aspect of the invention, gate electrode protective layer is formed on the gate electrode, and ion implantation of impurity is performed to form the source/drain regions using the gate electrode protective layer as a mask, so that it is possible to prevent ion implantation of impurity into the top surface of gate electrode during the ion implantation. Thereby, it is possible to prevent increase of the sheet resistance of the metal silicide layer formed on the top surface of the gate electrode. The gate electrode protective layer may be formed to include the oxide film formed on the top surface of the gate electrode and the etching stopper layer formed on the oxide film, in which case implantation of impurity into the top surface of the gate electrode can be easily prevented even if the source/drain regions having the LDD structure are formed. The gate electrode protective layer may be formed of the photoresist, in which case implantation of impurity into the top surface of the gate electrode can be easily prevented without complicating the manufacturing steps.

According to the method of manufacturing the field effect transistor of another aspect of the invention, ion implantation is performed to form the first source/drain regions with a mask formed of the first cover layer covering the second transistor formation region as well as the first gate electrode protective layer formed on the first gate electrode, and ion implantation is performed to form the second source/drain regions with a mask formed of the second cover layer covering the first transistor formation region and the second gate electrode protective layer formed on the second gate electrode, so that it is possible to prevent ion implantation of impurity into the top surfaces of the first and second gate electrodes at the ion-implanting step for forming the first and second source/drain regions. Thereby, it is possible to prevent increase of the sheet resistance of the metal silicide layer formed on the top surfaces of the first and second gate electrodes. According to the method of manufacturing the field effect transistor of still another aspect of the invention, the cover layer is formed to cover the gate electrode after ion implantation is performed using the gate electrode as a mask, and then the cover layer is etched back to expose the top surface of the gate electrode for etching the top surface of the gate electrode through a predetermined thickness, whereby the impurity implanted region formed at the top surface of the gate electrode can be easily removed. Thereby, it is possible to prevent increase of the sheet resistance of the metal silicide layer formed on the top surface of the gate electrode.

According to the method of manufacturing of the field effect transistor of yet another aspect of the invention, after ion implantation of impurity is performed to form the first and second source/drain regions using the first and second gate electrodes as a mask, the cover layer is formed to cover the first and second gate electrodes, and then the cover layer is etched back to expose the top surfaces of the first and second gate electrodes. The exposed top surfaces of the first and second gate electrodes are etched through a predetermined thickness, so that it is possible to remove easily the impurity implanted regions located at the top surfaces of the first and second gate electrodes. Thereby, it is possible to prevent increase of the sheet resistance of the metal silicide layer formed at the top surface of the gate electrode.

According to the method of manufacturing the field effect transistor of further another aspect of the invention, after the semiconductor layer is grown on the top surface of the gate electrode, the semiconductor layer is silicided to form the metal silicide layer, so that it is possible to prevent increase of the sheet resistance of the metal silicide layer even if the impurity implanted region is formed at the top surface of the gate electrode.

According to the method of manufacturing the field effect transistor of the further aspect of the invention, after the semiconductor layers are selectively grow on the top surfaces of the first and second gate electrodes, the semiconductor layers are silicided to form the metal silicide layers, whereby it is possible to prevent increase of the sheet resistance of the metal silicide layers even if the impurity implanted regions are formed at the top surfaces of the first and second gate electrodes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a field effect transistor, comprising the steps of:

forming a gate electrode having side surfaces and a top surface on a main surface of a semiconductor substrate;

forming a gate electrode protective layer on said gate electrode;

ion-implanting an impurity into the main surface of said semiconductor substrate by rotary implantation at an implantation angle of about 45° to form a first source/drain region having a low impurity concentration using said gate electrode protective layer as a mask;

depositing an insulating layer on the surface and anisotropically etching the deposited insulating layer to form a sidewall insulating layer in contact with the side surfaces of said gate electrode;

removing said gate electrode protective layer;

depositing a metal layer on the surface in contact with the source/drain regions and the top surface of the gate electrode; and heat treating to form a metal silicide layer on said source/drain regions and on the top surface of said gate electrode in a self-aligned manner; wherein said gate electrode protective layer includes a silicon oxide film formed on the top surface of said gate electrode and an etching stopper layer formed on said oxide film.

2. The method of manufacturing the field effect transistor according to claim 1, wherein said etching stopper layer is formed of a TiN layer.

3. The method of manufacturing the field effect transistor according to claim 1, wherein said gate electrode is formed of a doped polysilicon layer.

* * * * *

UNITED STATES PATENT AND TRADEMARK OFFICE
CERTIFICATE OF CORRECTION

PATENT NO. : 5,773,347
DATED : June 30, 1998
INVENTOR(S) : Masatoshi KIMURA et al.

It is certified that error appears in the above-indentified patent and that said Letters Patent is hereby corrected as shown below:

On the title page, item [54] should read as follows:

--[54] METHOD OF MANUFACTURING FIELD EFFECT TRANSISTOR--

Signed and Sealed this

Second Day of February, 1999

Attest:

Attesting Officer

*Acting Commissioner of Patents and Trademarks*